(12) United States Patent
Lenjani et al.

(10) Patent No.: US 11,049,551 B2
(45) Date of Patent: Jun. 29, 2021

(54) MEMORY DEVICES PROVIDING IN SITU COMPUTING USING SEQUENTIAL TRANSFER OF ROW BUFFERED DATA AND RELATED METHODS AND CIRCUITS

(71) Applicant: University of Virginia Patent Foundation, Charlottesville, VA (US)

(72) Inventors: Marzieh Lenjani, Charlottesville, VA (US); Patricia Gonzalez, Knoxville, TN (US); Mircea R. Stan, Charlottesville, VA (US); Kevin Skadron, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 16/682,151

(22) Filed: Nov. 13, 2019

(65) Prior Publication Data

US 2021/0142846 A1    May 13, 2021

(51) Int. Cl.
| | |
|---|---|
| *G06F 7/57* | (2006.01) |
| *G11C 11/4093* | (2006.01) |
| *G11C 11/408* | (2006.01) |
| *G06F 13/16* | (2006.01) |
| *G11C 11/4096* | (2006.01) |

(52) U.S. Cl.
CPC ............ *G11C 11/4093* (2013.01); *G06F 7/57* (2013.01); *G06F 13/1668* (2013.01); *G11C 11/4082* (2013.01); *G11C 11/4096* (2013.01); *G11C 11/4087* (2013.01)

(58) Field of Classification Search
CPC ............ G11C 11/4093; G11C 11/4082; G11C 11/4096; G11C 11/4087; G06F 7/57; G06F 13/1668
See application file for complete search history.

(56) References Cited

U.S. PATENT DOCUMENTS

| | | | | |
|---|---|---|---|---|
| 2015/0193157 A1* | 7/2015 | Hwang | ................. | G11C 29/52 |
| | | | | 714/764 |
| 2018/0366201 A1* | 12/2018 | Murakami | ............. | G11C 7/106 |

OTHER PUBLICATIONS

Seshadri et al.; *Ambit: In-Memory Accelerator for Bulk Bitwise Operations using Commodity DRAN Technology*; MICRO-50 (2017) pp. 273-287.
Seshadri, et al; *Fast Bulk Bitwise AND and OR in DRAM*; IEEE Computer Archticture Letters; vol. 14, No. 2; Jul.-Dec. 2015; pp. 127-131.

(Continued)

*Primary Examiner* — Jay W. Radke
(74) *Attorney, Agent, or Firm* — Stanek Lemon Crouse & Meeks, P.A.

(57) ABSTRACT

A method of processing data in a memory can include accessing an array of memory cells located on a semiconductor memory die to provide a row of data including n bits, latching the n bits in one or more row buffer circuits adjacent to the array of memory cells on the semiconductor memory die to provide latched n bits operatively coupled to a column address selection circuit on the semiconductor memory die to provide a portion of the n latched bits as data output from the semiconductor memory die responsive to a memory read operation, and serially transferring the latched n bits in the row buffer circuit to an arithmetic logic unit (ALU) circuit located adjacent to the row buffer circuit on the semiconductor memory die.

19 Claims, 7 Drawing Sheets

(56) References Cited

OTHER PUBLICATIONS

Li et al.; *DRISA: A DRAM-based Reconfiguration In-Situ Accelerator*; MICRO-50 (2017) pp. 288-301.
Chang, et al.; *Low-Cost Inter-Linked Subarrays (LISA): Enabling Fast Inter-Subarray Data Movement in DRAM*; IEEE; (2016); pp. 568-580.
Li et al.; *SCOPE: A Stochastic Computing Engine for DRAM-based In-situ Accelerator*; IEEE, (2018); pp. 696-709.

* cited by examiner

| NEXTPC1 (2 bB) |
| --- |
| NEXTPC2 (2 B) |
| NEXTPC_COND (3 B) |
| OPCODE1 (3 B) |
| OPCODE2 (3 B) |
| SRC1OP1 (3 B) |
| SRC2OP1 (3 B) |
| SRC1OP2 (3 B) |
| SRC2OP2 (3 B) |
| SHIFTCOND1 (3 B) |
| SHIFTCOND2 (3 B) |
| SHIFTCOND3 (3 B) |
| SHIFTDIR1 (1 B) |
| SHIFTDIR2 (1 B) |
| SHIFTDIR3 (1 B) |
| REPEAT (6 B) |
| OUTSRC (1 B) |

MEMORY DEVICES PROVIDING IN SITU COMPUTING USING SEQUENTIAL TRANSFER OF ROW BUFFERED DATA AND RELATED METHODS AND CIRCUITS

STATEMENT OF FEDERAL SUPPORT

This invention was made with government support under Grant. No. HR0011-18-3-0004 (DARPA). The government has certain rights in the invention.

FIELD

The present inventive concept relates to the field of electronics in general and, more particularly, to electronic memory systems.

BACKGROUND

Many modern and emerging applications can be memory intensive, where the cost of moving data from memory to a processor can dominate the cost of computations. In-situ approaches can process data physically close to memory cells, such as in the row buffer of each subarray, immediately after the data is read from the sub-array. While this approach may reduce the cost of data movement and can also provide parallelism across subarrays, current in-situ approaches are limited to only certain row-wide operations applied uniformly across the row buffer. Such approaches may not support common operations (such as 32-bit addition and multiplication), operations with data dependency, and operations based on predicates.

Moreover, with current peripheral logic, communication among subarrays may be inefficient. The energy consumption and execution time of applications with low computational intensity (low computation per datum) is mainly due to the high cost of data movement. Many applications, such as data analytics, scientific computing, graph processing, and machine learning, can be memory-intensive. To minimize the cost of data movement, recent studies have explored the possibility of processing data inside the memory (PIM).

SUMMARY

Embodiments according to the present invention can provide memory devices providing in situ computing using sequential access to row buffered data and related methods and circuits. Pursuant to these embodiments, a method of processing data in a memory can include accessing an array of memory cells located on a semiconductor memory die to provide a row of data including n bits, latching the n bits in one or more row buffer circuits adjacent to the array of memory cells on the semiconductor memory die to provide latched n bits operatively coupled to a column address selection circuit on the semiconductor memory die to provide a portion of the n latched bits as data output from the semiconductor memory die responsive to a memory read operation, and serially transferring the latched n bits in the row buffer circuit to an arithmetic logic unit (ALU) circuit located adjacent to the row buffer circuit on the semiconductor memory die.

In some embodiments, a row buffer memory circuit can include a plurality of rows of storage circuits configured to store row-major ordered data received from a memory array in the plurality of rows of storage circuits and configured to sequentially transfer portions of the row-major ordered data into and/or out of the row buffer memory circuit.

In some embodiments, a memory device can include a first sub-array located in an integrated circuit memory device package and configured to provide a first portion of a row of data. A first row buffer memory circuit can be located in the integrated circuit memory device package adjacent to the first sub-array and configured to store first row-major ordered data received from the first sub array and configured to sequentially transfer the first row-major ordered data into and/or out of the first row buffer memory circuit in column-major order. A second sub-array can be located on the semiconductor memory die configured to provide a second portion of the row of data, wherein the first and second portions provide the row of data including the n bits. A second row buffer memory circuit can be located in the integrated circuit memory device package adjacent to the second sub-array and configured to store second row-major ordered data received from the second sub array and configured to sequentially transfer the second row-major ordered data into and/or out of the second row buffer memory circuit in column-major order. An arithmetic logic unit (ALU) circuit can be in the integrated circuit memory device package and located adjacent to the first and second sub-arrays. The ALU circuit can have first and second inputs that are coupled to the first and second row-major ordered data, which is received in the column-major order, serially in portions, to global data lines. At least one temporary register, an output of the ALU circuit and a control circuit can be operatively coupled to the first and second sub arrays, to the first and second row buffer memory circuits, and to the ALU circuit, which is configured to select inputs to the first and second inputs to the ALU circuit and configured to provide instruction to ALU circuit to operate on the first and second inputs to the ALU circuit.

DETAILED DESCRIPTION OF EMBODIMENTS ACCORDING TO THE INVENTION

Exemplary embodiments of the present disclosure are described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

As appreciated by the present inventors, in some embodiments according to the invention, a row buffer circuit can receive a row of data from a sub-array, which can then be transferred sequentially, in portions, as part of a serial transfer, to provide for example an operand, to an ALU. The row buffer circuit can be located on the same die (and in the same IC package) as the sub-array and can be located on the die directly adjacent to the sub-array. The row buffer circuit can include a number of rows each of which can store data that can be transferred in portions sequentially. For example, in some embodiments, the row buffer circuit can store a row of data in latches, where each latch can be separately enabled onto a local bus that is coupled to the ALU. The sequential transfer of the row data in portions (for example in portions that are equal to a word or 32 bits) can be provided by enabling the data stored in each latch onto the bus at a different time. Accordingly, if 256 bytes of row data were stored in the row buffer circuit in 32 bit latches (64 latches each latch latching 32 bits), the row data may be transferred in 64 cycles.

In some embodiments according to the invention, the data from each latch can be enabled onto the bus through a pass-transistor that is coupled to the output of the latch where the data is "passed" through the transistor responsive to an enable signal. In some embodiments, the enable signal can be provided a code stored in a sequential enable storage circuit, where the code can be shifted through a shift register circuit where each stage of the shift register is coupled to the gate of one of the pass-transistors. When the code is shifted into a particular stage of the shift register the code is provided to the gate of the corresponding pass-transistor which allows the data stored by the latch to pass-through the pass-transistor and onto the bus to the ALU circuit. In some embodiments, each of the rows in the row buffer circuit can have a dedicated sequential enable storage circuit.

In some embodiments, the row buffer circuit can include two rows where each of these rows can be configured to sequentially transfer data to the ALU circuit as operands relative to an operator provided by a controller circuit. In operation the ALU circuit can perform the operator on the operands in 32 bit portions where each result generated by the ALU circuit can be sequentially transferred and stored as a third row data of the ALU circuit, which may then be re-written to the sub-array from the row buffer circuit. It will also be understood that the rows in the row buffer circuit can be configured to sequentially transfer row data in either direction.

In some embodiments, one of the rows in the row buffer circuit can include a sense amplifier circuit and the latch circuit, where for example the memory sub-array is an array of DRAM memory cells. The remaining rows of the row buffer circuit can, however, be free of a sense amplifier circuit as the function of the sense amplifier can be shared by the first row of the row buffer circuit. It will be understood that the size of the row buffer circuit and the size of the portions that are sequentially transferred can vary and is not limited by this disclosure to a particular size. Also, the row buffer circuit can include an any number of rows. Still further, it will be understood that each sub-array can have an associated portion (such as half) of the row buffer circuit. For example, the row buffer circuit for a particular sub-array can be provided in two separated portions (for example, one half above the array and the other half below the array). However, as illustrated herein the row buffer circuit can be shown in a logical form where both halves are represented by one illustration of the row buffer circuit. It will be understood that the row-buffer circuit can be included in any type of memory device such as a volatile memory (e.g., a DRAM, SRAM, etc.), a non-volatile memory (e.g., FLASH, NOR, Charge trap, MRAM, MTJ, etc.) and other types of memory.

In still further embodiments according to the invention, a pair of sub-arrays (along with the row buffer circuits associated with those sub-arrays) can be coupled to a single Arithmetic Logic Unit (ALU) circuit which can perform logical operations on operands provided by the row buffer circuits as described herein. For example, the ALU circuit can have two inputs, each of which can be coupled to a respective one of the row buffer circuits which can be configured to receive the sequential transfer of data from the respective sub-arrays. The row buffer circuits can store data that is stored in an interleaved fashion at the sub-array level. The output of each of the row buffer circuits can be routed to the sub-array, which is located directly adjacent to the row buffer circuits. The data bits stored in the row buffer circuits can be provided to an input to the ALU circuit so that the data interleaving is removed.

In some embodiments according to the invention, the ALU circuit is coupled to a controller circuit and instruction buffer that are configured to operate the sub-arrays, the row buffer circuits, the ALU circuit, various temporary registers and bus transactions to carry out the functions described herein. In some embodiments, the controller circuit and instruction buffer can control the inputs provided to the ALU circuit. For example, the controller circuit can select the first and second rows of the row buffer circuit as the first and second inputs to the ALU circuit, wherein the instruction to be executed specifies the row data as the operands. In some embodiments according to the invention, the controller circuit can select row buffer data broadcasted from a third sub-array (not directly under control of the controller circuit) as an input to the ALU circuit. In still other embodiments, other inputs (such as a temporary register or the output of the ALU circuit) can be selected as inputs. In still further embodiments, the controller circuit can select that the output of the ALU circuit can be fed-back to an input of the ALU circuit, broadcast to another sub-array, re-written to the sub-array (via a third row of the row buffer circuit), etc.

It will be understood that, as described herein, a memory array can be a memory sub-array that provides a random access memory which stores data in a particular row-major order, wherein data words are located in contiguous memory locations such that when the contiguous data words are accessed they are retrieved as a row of data in row-major order (for storage in a row of the row buffer circuit). The row of data can be sequentially transferred out of the row buffer circuit in column-major order to the ALU circuit. In other words, whereas the data words fetched from the memory array are in row-major order, the portions of the data words are sequentially outputted in column-major order.

Accordingly, as appreciated by the present inventors, a processing unit according to embodiments of the invention can provide 32-bit addition, subtraction, and multiplication (in addition to bitwise operations) at the subarray-level and which can reduce the hardware overhead by performing operations on only a word (i.e., 32 bits) of the row buffer. Although this processing unit may process a portion (1/64) of the row buffer per cycle, it can provide a significant performance improvement overall. Evaluation shows that performing complex operations on a subset of the row buffer can outperform conventional in-situ approaches that perform computation on the whole row buffer but emulate complex operations by multiple bit-wise operations.

Furthermore, a modification of the mat-interleaving circuits to transfer all bits of a word to the side of a subarray (reuniting interleaved bits) can prove that all bits are physically close to each other. Since only one word is processed in each cycle, the circuits for reuniting one word do not impose significant hardware overhead.

Still further, data can be broadcast between sub-arrays to reduce the cost of inter-subarray data movement. In some embodiments, low-cost inter-linked subarrays (LISA)) can be used to transfer a row from one subarray to another, thereby reducing the overhead of inter-subarray data movement. Further, for applications with independent column access requirements, embodiments according to the invention, a light-weight independent column selection mechanism can be provided by storing one-hot-encoded values of the column address in latches.

In some embodiments, rows of the row buffer circuits (sometimes referred to as "walkers") can provide sequential access in conjunction with the light-weight column-selection mechanism. In some embodiments, one of the "walkers" may be implemented using row buffers with latching properties (provided, for example) using the sense amplifiers (SAs). Other ones of rows can be implemented by latches. Walkers can store the input operands of the computation (which may be read from the sub-array) or the output of the computation (to be written in the memory sub-array), (ii) a small programmable instruction buffer, where the pre-decoded signals for the computation can be stored, (iii) a simple controller that determines the next operation and direction of the sequential access, and (iv) a one-word ALU circuit.

The flexibility of embodiments according to the invention may by optimized by mapping of important applications from different domains such as linear algebra, machine learning, deep learning, database management system (DBMS), as well sparse matrix-vector multiplication and sparse matrix-matrix multiplication that appear in scientific computing, graph processing and deep learning.

Figure 1:
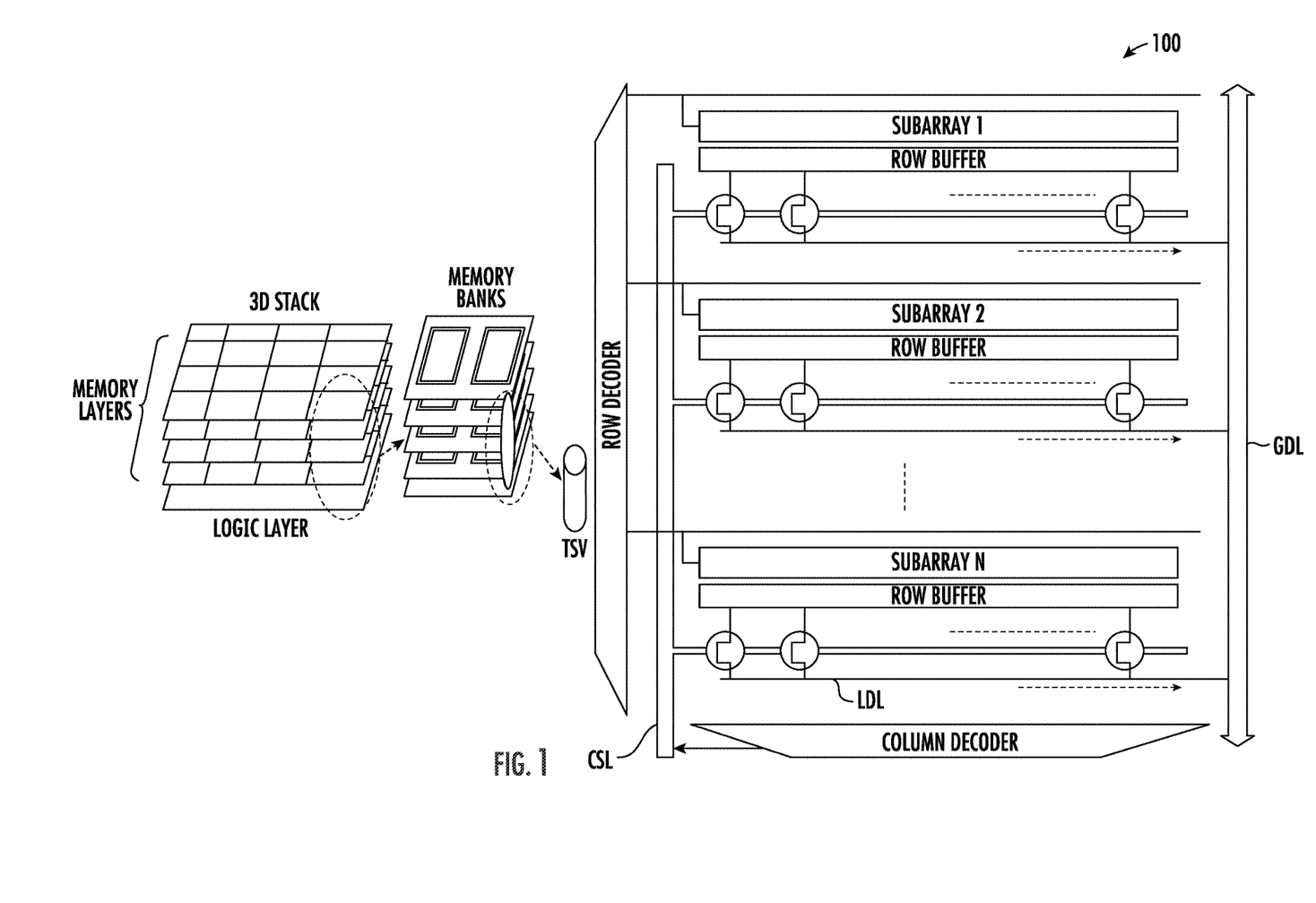
FIG. 1 is a schematic representation of a 3D stacked DRAM memory which illustrates the hierarchy of memories included in the stack.

FIG. 1 is a schematic representation of a 3D stack of DRAM memory that illustrates the hierarchy of memories included in the 3D stack in some embodiments according to the invention. According to FIG. 1, each 3D stack has one logic layer and multiple memory layers. Each stack is divided into multiple vaults (e.g. 16 or 32). The Layers are connected via TSVs (through-silicon vias) which can act as a shared bus. This shared bus can be a bottleneck as it can serialize access to all subarrays in a vault.

It is possible to employ a segmented TSV, where every two layers are connected through one separate TSV, and data from upper layers is buffered in each layer before being sent to the lower layers. Although segmented TSVs can increase the access bandwidth, they may also increase the latency and the energy consumption of data movements (due to the extra cost of buffering and arbitration).

Each layer of each vault can include a number of memory banks 100 (sometimes referred to as "bank"). FIG. 1 also shows the structure of a memory bank 100 comprising several subarrays where each subarray includes multiple rows that spans multiple columns of data. The column width varies in different DRAM configurations, however, some common column widths in DRAMs are 32, 64, 128 and 256 bits. To access one column of the data from a bank 100, a row address is sent to all row decoders in all subarrays via the address bus for the memory bank. The row decoder selects the corresponding subarray and the corresponding row. The entire of data row is read out and is stored in a row-wide buffer (sometimes referred to as a row buffer or row buffer circuit) in the subarray.

To select one column from the row buffer circuit, the column address is sent to the column decoder, at the edge of the memory bank 100. The column decoder decodes the column address and sends the decoded bits to each subarray through column selection lines (CSL). The pass transistors/multiplexer in each subarray receive the decoded column address on CSLs and select the requested column and send it to the local data line (LDL), in each subarray. The data on LDL is sent to the logic-layer via global data lines (GDL).

As appreciated by the present inventors, two aspects of the 3D stack memories can lend particular suitability to embodiments according to the present invention as described herein: (i) the logic layer, and (ii) shared TSVs. As described herein embodiments according to the present invention can employ the shared TSVs for broadcasting data words between sub-arrays to be used, for example, as an operand in conjunction with an operator provided as part of an instruction by another controller circuit.

As further appreciated by the present inventors, conventional in-situ approaches have employed non-flexible row-wide operations. As a result, they may not support operations with dependency along the row buffer. For example, in operations such as Scan, the value of each partial sum depends on the value of the previous partial sum. Those approaches also may not support algorithms that check a condition on a value and perform a different operation based on the outcome of the condition. For example, Radix sort is an algorithm that sorts data by grouping values by the individual digits which share the same significant position. Each iteration of this sort algorithm packs values into two different buffers. The target buffer for the value is determined by the digit that is being processed at that iteration. In contrast, in some embodiments, multiplication and accumulation operation are performed on non-zero values, whose index matches.

Adding cores with traditional access and control mechanism, at the subarray level as is done in some approaches may be impractical. In such complex control and access models, the core reads and decodes the instruction and sends a request for data to the local memory elements (L1, register files, or scratchpad) along with the address of the request. This model may be inefficient for in-situ processing for two reasons. First, the core in DRAM layer has a much lower frequency and consequently each stage of the decode, memory read, execution and write-back imposes significant overhead. Furthermore, the core may not employ out of order execution (due to the hardware overhead) to resolve data dependencies. Second, adding peripheral logic for random and independent column access may impose significant hardware and performance overhead.

In contrast, as described herein some embodiments according to the invention can provide a tradeoff between flexibility and practicality. For example, in some embodiment operations with data dependency and operation based on predicates are enabled, while also avoiding the overhead of sophisticated control mechanisms and the overhead of accessing data by address.

Figure 2:
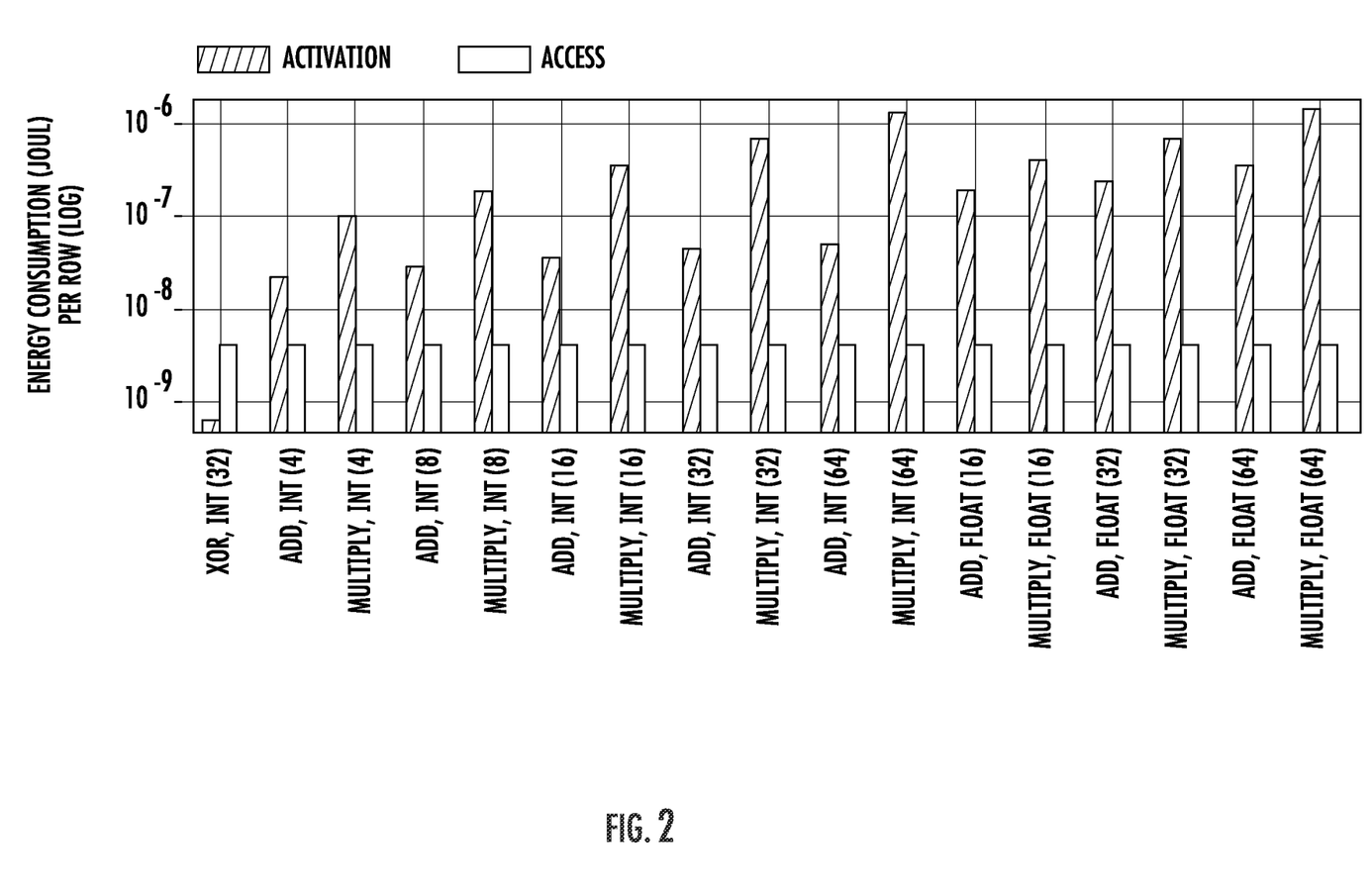
FIG. 2 is a chart showing the energy consumption of row activation for emulating complex operations by bitwise operations and the energy consumption of sending data to the logic layer shown in FIG. 1.

As further appreciated by the present inventors, some conventional approaches evaluated a spectrum of in-situ computing such as evaluating row-wide bitwise operations using computation capability of bitlines without adding any extra gate, realized by activating two rows at the cost of destructing the values in both rows, requiring extra copies before each operation. Other conventional approaches evaluated row-wide bitwise ALUs, shifters, and latches (the latches eliminate the extra copies), emulating 4-bit addition and 2-bit multiplication using bitwise ALUs. This conventional approach also evaluated adding row-wide 4-bit adders to the row buffer and reported that adding row-wide 4 bit adders which increased the area by 100%. Unfortunately, emulating complex operations such as addition or multiplication using bitwise ALUs requires reading and writing multiple rows. Since row activation is very costly, the energy consumption of row activation for emulating complex operations by bitwise operations surpasses the energy consumption of sending data to the logic layer, as shown in FIG. 2.

As further appreciated by the present inventors, three shared resources in the design of the memory: (i) TSVs, shared among all layers in a vault (as shown in FIG. 1), (ii) the shared CSLs, and (iii) the GDLs, shared among all subarrays in a bank. Given the shared CSLs, only one column can be selected from a bank at a time and with shared GDLs, only one column can be transferred at a time. As a result, conventional peripheral logic and interconnections may limit the performance of in-situ approaches in three ways: (i) they may not be capable of broadcasting values for efficient data sharing, (ii) narrow GDLs are the only means for movement of an entire row from one subarray to another, (iii) the peripheral logic for column access (the column decoder) is shared among all subarrays as shown in FIG. 1. The shared peripheral logic can limit the flexibility and parallelism of any potential in-situ approach that uses independent and parallel column access to the row buffer of individual subarrays.

Figure 3:
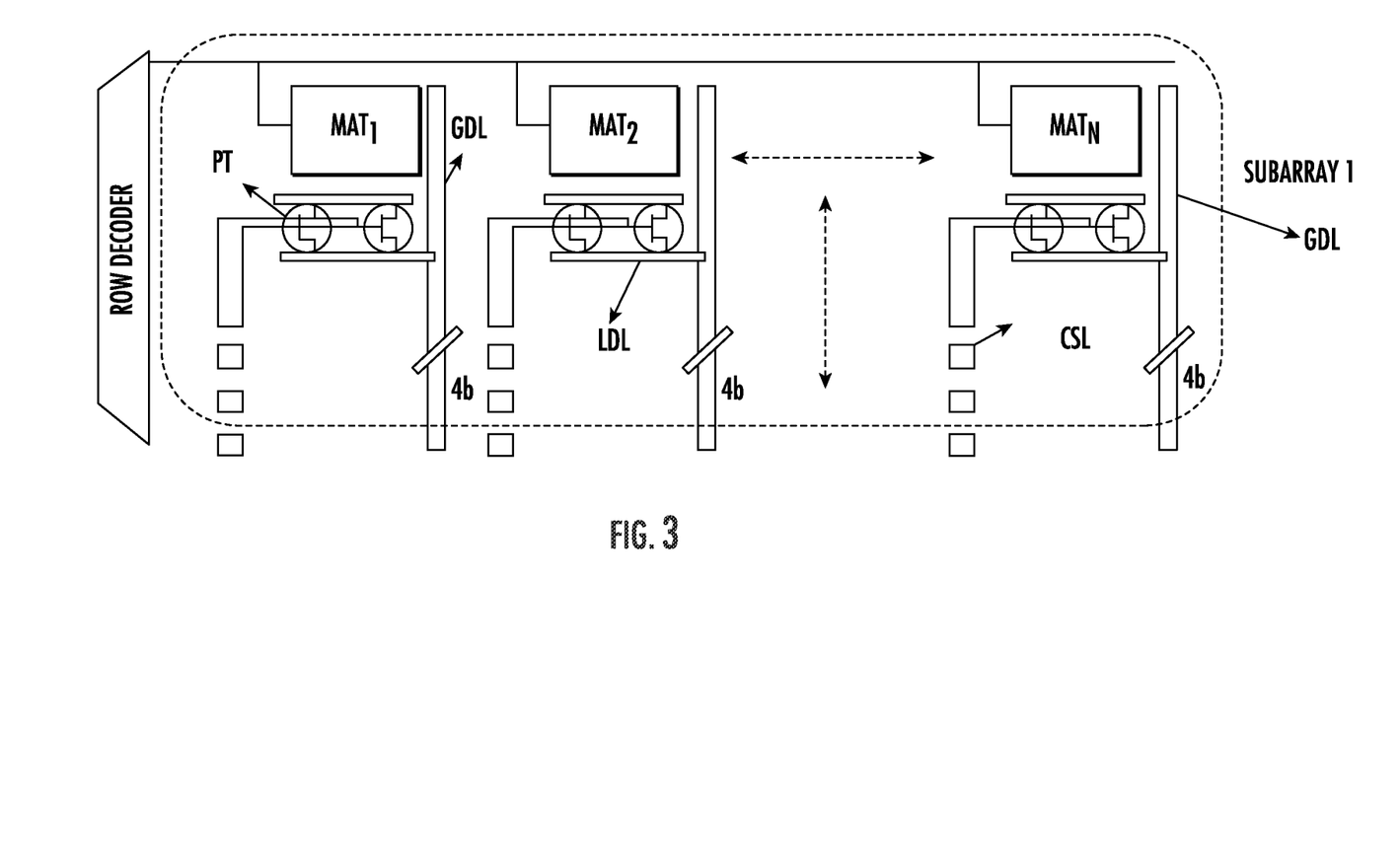
FIG. 3 is schematic representation of MAT interleaving.

As further appreciated, in conventional DRAMs, two types of interleaving are generally used: (i) MAT interleaving, and (ii) subarray interleaving. MAT interleaving is shown in FIG. 3, where each subarray is divided into multiple MATs. The GDLs are distributed among MATs and each MAT has 4 bits of the GDLs. Therefor for selecting the same column from all MATs, CSLs are repeated for each MAT. Pass transistors (PTs) receive CSLs, select a column, and place it on LDLs, which is sometimes referred to as MAT interleaving which can be efficient for random column access as it can reduce the LDLs's latency (LDLs in FIG. 3 are shorter than LDLs in FIG. 1). Without MAT interleaving LDLs may become wide and long, thereby causing the latency of the last column to be much longer than the latency of the first column.

The second type of interleaving is subarray interleaving or open-bitline architecture where data is spread across multiple sub-arrays such that when data is read from the sub-arrays, the interleaving should be removed to provide the data in the original format (non-interleaved). Since the size of a sense amplifier is larger than a cell, some DRAM designs may accommodate less than all of the sense amplifiers needed for an entire row. To sense the entire row of cells, each subarray has bitlines that may connect to two rows of sense amplifiers, one above the sub-array and one below the subarray.

As further appreciated, interleaving can make the memory more robust against multiple-bit upset, where soft errors change the value of adjacent cells. With interleaving, bits in a column are not physically close to each other and consequently, multiple-bit upset only changes one bit from a column and then error detection mechanisms (which can detect one error) can detect the error. Due to the interleaving, logically adjacent bits are not physically adjacent. With row-wide operations the circuits for changing the layout and reuniting the interleaved bits impose a significant hardware overhead.

Figure 4:
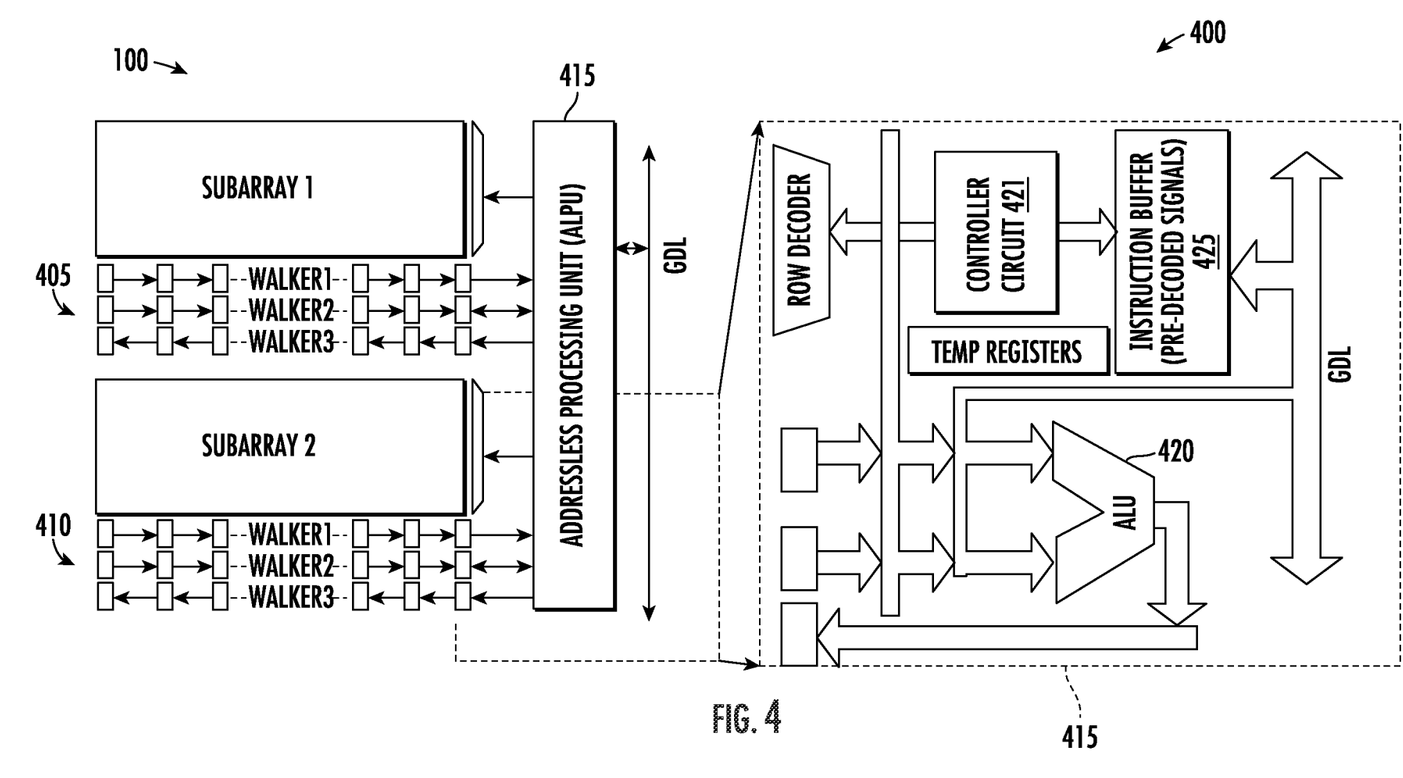
FIG. 4 is a block diagram of an in-situ processing circuit supporting sequential transfer of portions of row data including two components (i) a row buffer circuit configured to sequentially transfer row data in portions (as well as supported random access reads and writes), and (ii) an Address-Less Processing Unit (ALPU) including an ALU that can receive the row data transferred from the row buffer circuit in sequential portions in some embodiments according to the invention.

FIG. 4 is a block diagram of an in-situ processing circuit supporting sequential transfer of portions of row data including two components (i) a row buffer circuit 405 and 410 configured to sequentially transfer row data in portions (as well as supported random access reads and writes) which are sometimes referred to herein as "walkers", and (ii) an AddressLess Processing Unit (ALPU) 415 providing a number of processing components such as an instruction buffer 425 and a control circuit as well as an ALU circuit 420 that can receive the row data transferred from the row buffer circuit 405 and 410 in sequential portions and sequentially write result data back to a row in the row buffer 405 and 410 in some embodiments according to the invention.

In some embodiments, two of the rows in the row buffer circuit 405 and 410 can be implemented by two rows of latches that are connected to the ALU circuit 420 in the ALPU 415, for example, by a bus that is similar to LDLs. The third row of the row buffer circuit 405 and 410 can be a slightly modified row of Sense Amplifiers (SA) as described herein, so that SAs can fulfill both the amplifier function and the latching function.

As shown in FIG. 4, the ALPU 415 can include (i) a controller circuit 421, (ii) temp registers, (iii) the ALU circuit 420, and (iv) the instruction buffer 425.

As appreciated by the present inventors, since in-situ approaches are beneficial for algorithms that process the entire row buffer, embodiments according to the present invention can employ an access mechanism that sequentially transfers the entire data in row buffer circuit in portions. Hence, instead of accessing memory elements by address, embodiments according to the present invention employ three rows, sometimes called walkers. Each Walker can either capture a row of input operands (read from the subarray) or store a row of target variables (before being written to the subarray). Embodiments according to the present invention can read/write to/from these rows of the row buffer circuit 405 and 410 sequentially and implement the sequential accesses by shifting a one-hot-encoded value that determines which column of the row should be put on the local bus. The controller circuit 421 can determine the direction of shifts for each walker and can also determine the next operation based on the outcome of the previous operation, providing flexibility.

Sequential access to the rows of the row buffer circuit can enable processing only one word (one column) at a time, and consequently there is no need for row-wide ALUs, A row-wide ALU, with bitwise operations, addition and multiplication—integer and floating point may be at least 52 times larger than the area of the sub-array. In some embodiments, addition, comparison (which also can be implemented by subtraction), multiplication, and bit-wise operations are the most common operations that appear in modern memory-intensive applications. Therefore, a one-word ALU circuit, which supports the above common operations can be used in some embodiments. The input operand of the ALU circuit can be provided by one of the four resources: (i) the value sequentially accessed from one of the row buffer circuit 405 and 410, (ii) the temp registers, (iii) the GDLs, or (iv) one of the outputs of the ALU circuit 420.

In some embodiments according to the invention, a broadcast command is also supported on which every ALPU 415 can receive and capture data on shared buses. Also, instead of using a column decoder and column address buses, which are shared among sub-arrays, embodiments according to the invention can employ column selection latches in each sub-array, where a one-hot-encoded value can be used to determine the selected column. In each cycle, based on the outcome of the previous operation, the controller circuit can determine in which direction the on-hot-encoded value should be shifted. Moreover, a Low-cost inter-linked sub-arrays (LISA) can be used to transfer an entire row at once to any other subarray in the same bank.

In some embodiments according to the invention, unlike reuniting an entire row, reuniting one word is possible through modification of the conventional MAT interleaving circuits. Therefore, interleaved bits of a word can transferred and reunited at the side of the subarray to perform arithmetic operations. To resolve sub-array interleaving, only one ALPU processing unit is used per two subarrays, as shown in FIG. 4.

Figure 5:
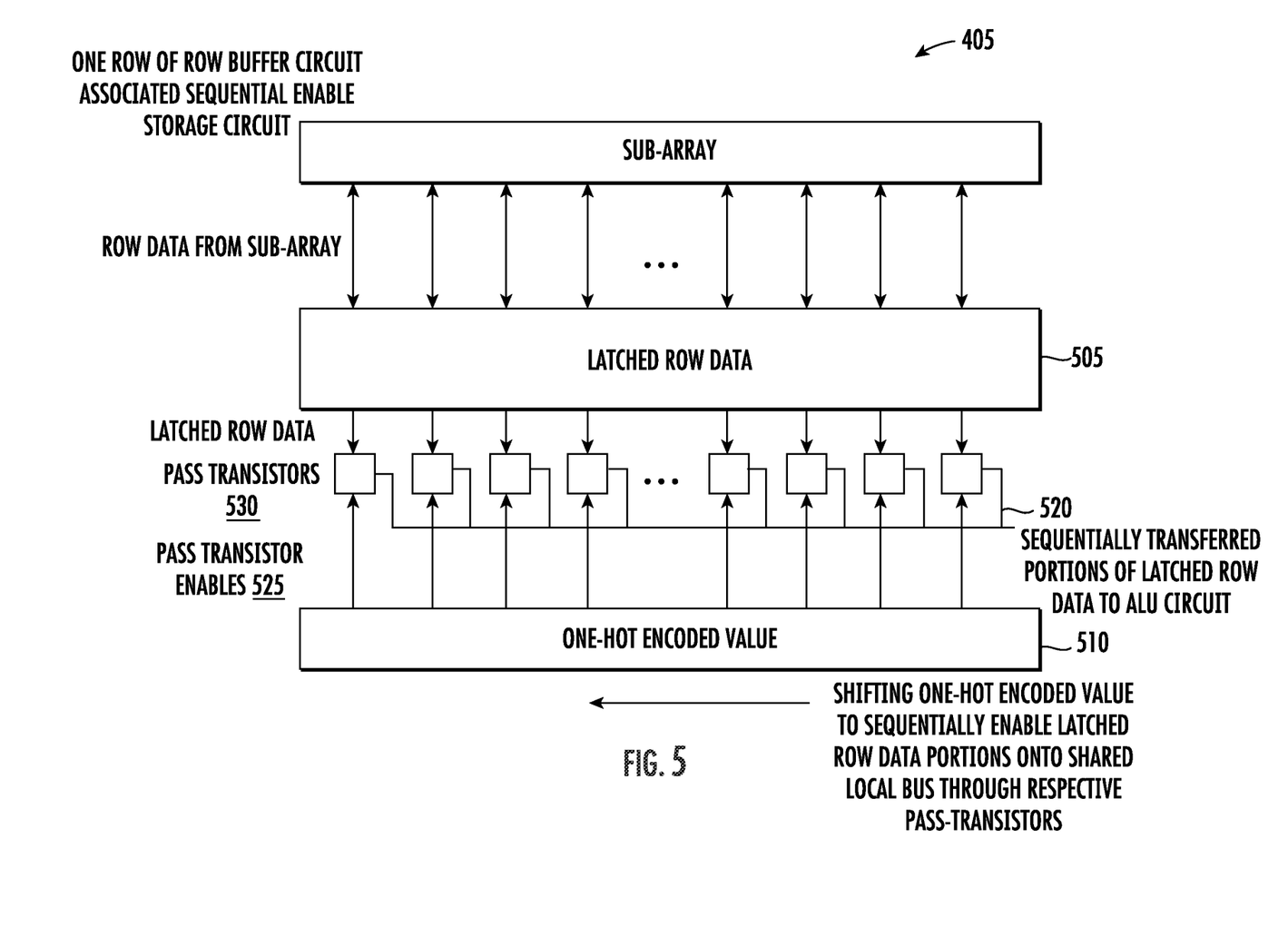
FIG. 5 is a schematic illustration of a single row of the row buffer circuit having inputs coupled to the bit lines of the sub-array and outputs coupled to a local bus configured to transfer latched data to the ALU circuit and illustrating a respective sequential enable storage circuit configured to sequentially enable the latches to sequentially transfer the latched data to the ALU circuit in some embodiments according to the invention.

FIG. 5 is a schematic illustration of a single row 505 of the row buffer circuit 405 having inputs coupled to the bit lines of the sub-array and outputs coupled to a local bus 520 configured to transfer latched data to the ALU circuit 420 and illustrating a respective sequential enable storage circuit 510 configured to sequentially enable the latches of the single row 505 to sequentially transfer the latched data to the ALU circuit 420 in some embodiments according to the invention. According to FIG. 5, a row of data is accessed from the sub-array and stored in the latches 505 under control of the controller circuit 420. As described herein, the row buffer circuit 405 shown in FIG. 5 can logically represent an entire row buffer circuit despite the fact that an actual row buffer circuit may physically be provided in separate areas relative to the sub-array.

According to FIG. 5, the latched row data 505 includes a plurality of latches each of which can store a portion of the row data. For example, in some embodiments where the row data includes 256 bytes, each of the latches may store a 32 bit portion of the row data. The data output of each latch is coupled to a respective pass transistor 530 that is enabled by a respective output from the sequential enable storage circuit 510. In particular, when the enable signal for a particular pass transistor 530 is received from the sequential enable storage circuit 510, the portion of the row data that is stored in the corresponding latch is "passed" by the pass transistor 530 to the local bus 520. Moreover, the sequential enable storage circuit 510 is configured to store and shift a one-hot encoded code that provides the enable signal for each of the pass transistors in a sequence so that only data stored in a single latch is enabled onto the local bus at one time. In operation, each of the portions of the data stored in the row of the row buffer circuit shown can be sequentially transferred to the ALU circuit 420.

It will be understood that the latched row data 505 is described above may also provide the second row of the row buffer circuit 405, which may have a dedicated sequential enable storage circuit 510 and may shift a corresponding one-hot encoded value in the same direction as that shown in FIG. 5 to enable the sequential transfer of the data from the second row into a second input of the ALU circuit 420 as, for example, an operand.

It will be understood that although the latched row data 505 is described above as being transferred to the ALU circuit 420, the row buffer circuit can also support a configuration where the latched row data 505 is sequentially transferred from the ALU circuit 420 into the latches to the provide the latched row data 505. In such embodiments, the data transferred from the ALU circuit 420 may represent a result generated by the ALU circuit using two operands, which may ultimately be written back to the sub-array. For example, a configuration such as that described above may provide the third row (Walker 3) of the row buffer circuit 405. It will be understood that the sequential enable storage circuit 510 associated with the third row (Walker 3) of the row buffer circuit 405 may be dedicated to the third row and may shift the one-hot encoded value in the opposite direction to enable the sequential transfer of the data into the third row.

Embodiments according to the present invention can resolve the MAT interleaving using a number of approaches. For example, one approach would be to change the layout and completely remove the MAT interleaving (if the target application does not need efficient random column access or is resilient against soft errors). As a side benefit of eliminating MAT interleaving, the area overhead of CLSs and columns selection logics is reduced (repeated for each MAT).

Figure 6:
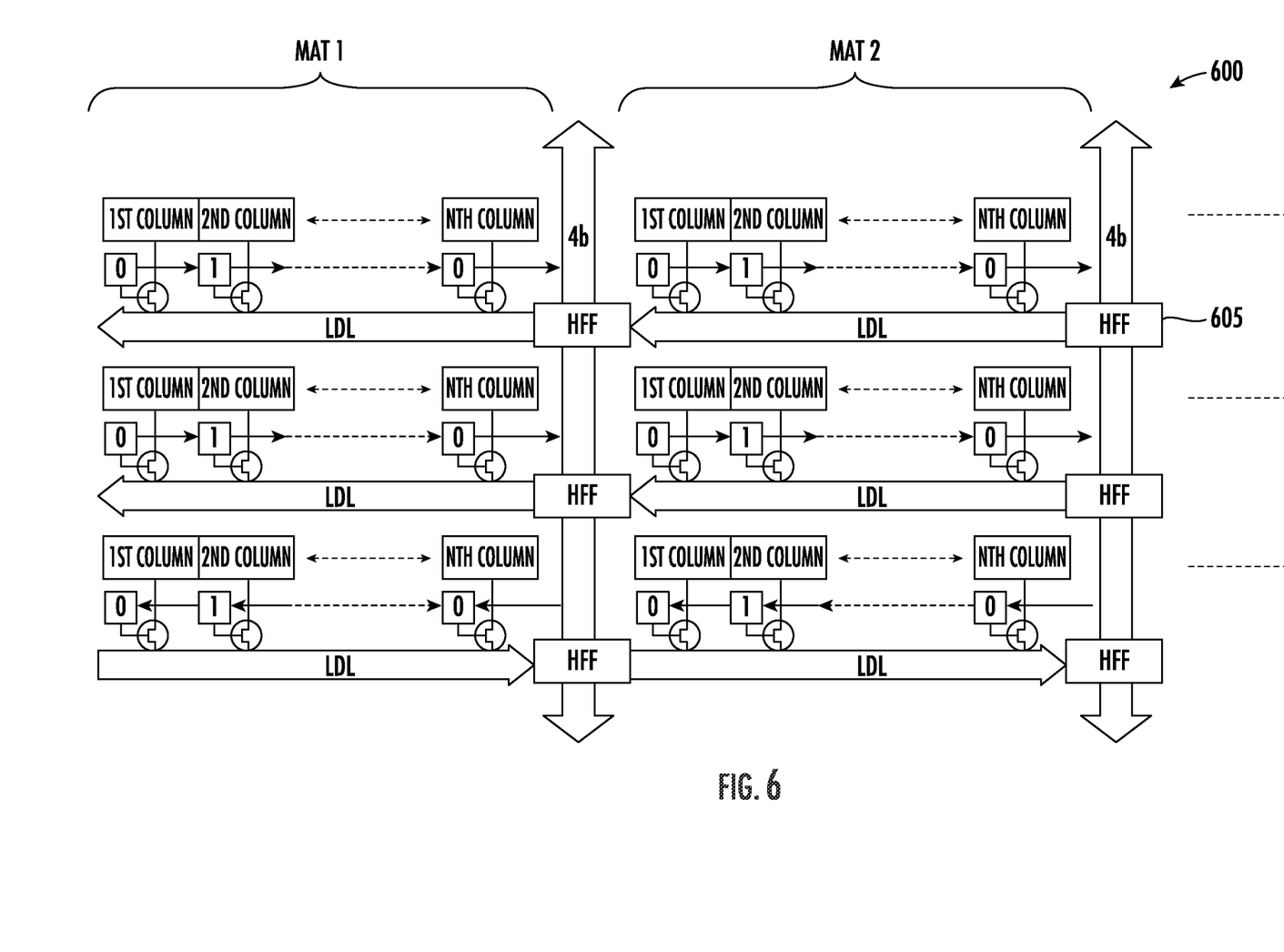
FIG. 6 is a block diagram that illustrates a row buffer circuit configured to sequentially transfer portions of the row data from a row buffer circuit through a pipeline across directly adjacent MATs using helper flip flops to adjacent to the sub-array in some embodiments according to the invention.

In another approach, the MAT interleaving is maintained as shown in FIG. 6 in some embodiments according to the invention. Specifically, FIG. 6 is a block diagram that illustrates a row buffer circuit 600 is configured to sequentially transfer portions of the row data from a row buffer circuit through a pipeline across directly adjacent MATs using helper flip flops 606 to adjacent to the sub-array in some embodiments according to the invention. As appreciated by the present inventors, in the traditional design of memory, each segment of the LDL corresponding to each MAT may be connected to four flip-flops 605 (called helper flip flops (HFF)). The HFF's can be connected to the segment of the LDL of the directly adjacent MAT to form a pipeline to transfer all values to the side of the subarray in a pipeline fashion. In a memory structure with 4 MATs per subarray, this pipeline requires four cycles to transfer 32 bits (16 bits from the upper walker and 16 bits from the lower walker). If the TSVs are used to send the clock signal, the clock cycle should be at least twice as long as the latency of the TSV (according to CACTI-3DD, the latency of TSV with 8 memory layers and one logic layer is more than 4.4 ns), which will significantly degrade throughput. To resolve this issue, embodiments according the present invention can employ segmented TSV as described herein for the clock signal (according to CACTI-3DD, the latency of segmented TSV is 0.3 ns).

As described herein the row buffer circuits can provide sequential transfer of the data stored in the row buffer circuits in portions to the ALU circuit (as well as sequential transfer of data in portions into the row buffer circuit from the ALU circuit for example). As described herein, in some embodiments, the row buffer circuit can operate employing shift registers (or shift latches, implemented by ping-pong shifting), and accessing the row sequentially by shifting the values. In other embodiments according to the invention, (where the interleaving is maintained) the row buffer circuits employ the structure of traditional row buffers and local buses (similar to LDLs) along with a column-selection mechanism that selects a column to be placed on the respective LDL (that is coupled to the latch providing that particular portion of the row buffer circuit). In addition to keeping the interleaved format, this approach provides two advantages: (i) enabling sequential read and write in both direction (with registers (in FIG. 4), we can only read by shifting to the right and write by shifting to the left), and (ii) consuming less energy (when we shift value, there will be value transition in all latches, whereas the second solution, only the value of the bus changes).

As described herein, conventional memories share the peripheral logic circuits for column selections. FIG. 1 shows that the CLSs (on which the decoded column address is placed), are shared among subarrays. FIG. 3 shows that CLSs are repeated for each MAT. To support operations based on predicates, independent column access is needed for all row buffer circuits and subarrays. Hence, in some embodiments column-selection latches can be provided wherein the one-hot-encoded value of a column is stored and shifted to access the next column, without requiring one column decoder per row buffer circuit, per subarray, and per MAT.

In some embodiments, the controller circuit can utilize a number of counters such as: (i) a 6-bit counter per row buffer circuit for detecting that the row buffer circuit has been fully-accessed (fully read or written). Each row buffer circuit can have a 2-bit latch that determines to the row buffer circuit should be used next when the current row buffer circuit is fully accessed, (ii) a 4-bit counter for counting the wait time for a new row to be read from the subarray and stored in the row buffer circuit, or for a row buffer circuit to be written to the subarray, and (iii) three 11-bit row counters which are initialized to the row address of the beginning of the data and will be compared against the end of the data in the subarray.

Figure 7:
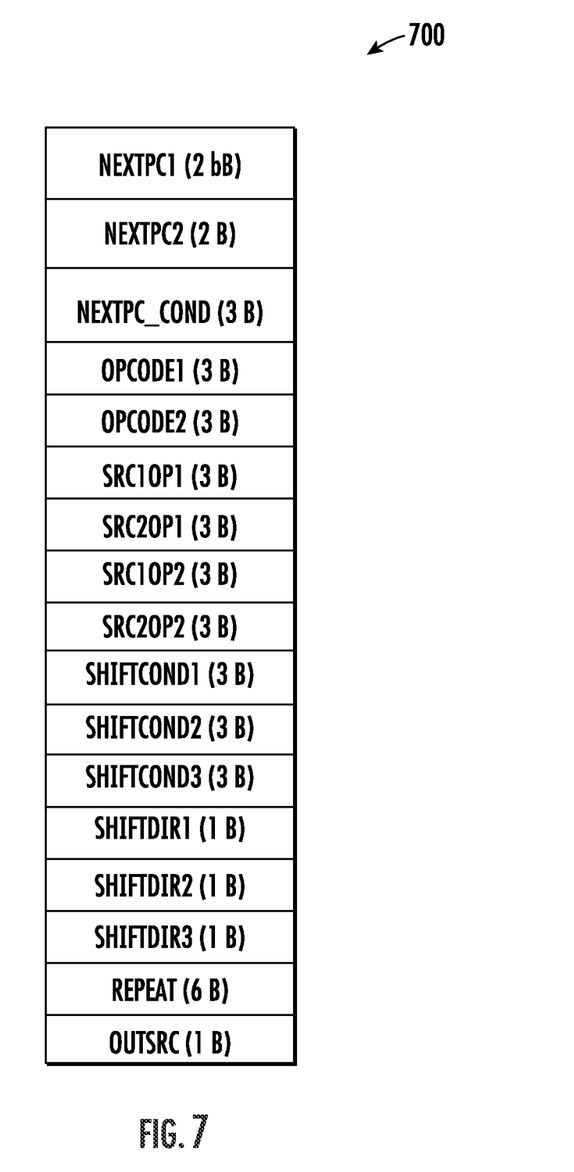
FIG. 7 illustrates the format of each entry of the instruction buffer in the ALPU in some embodiments according to the invention

FIG. 7 illustrates the format of each entry of the instruction buffer in the ALPU 415 in some embodiments according to the invention. This format allows two operations at the same time and has the following fields: (i) NextPc1 and NextPc2 that determine the program counter of the next instruction, (ii) NextPc_Cond determines the condition under which the controller switches to instruction determined by NextPc1 (otherwise it switches to NextPc2), (iii) opCode1 and opCode2 are the operation codes of each operation, (iv) Src1Op1, Src2Op1, Src1Op2, and Src2Op2 select a source for each input of the operation, (v) ShiftCon1, ShiftCon2, and ShiftCon3 specify the condition under which the corresponding row buffer circuit should be shifted, (vi) ShiftDir1, ShiftDir2, and ShiftDir3 determine the direction of shifts in each row, (vii) Repeats determines the number of times that the controller repeats the current instruction (reserved and not used in our evaluated applications), and (vii) OutSrc selects the operation whose output is shifted to the destination row.

An exemplary embodiment of operation of the row buffer circuit operating responsive to the controller circuit 421 using instructions in the instruction buffer 425 in some embodiments according to the present invention. In particular, for the sake of clarity exemplary steps for performing a simple kernel from the first level BLAS operations, Scale $z(i)=\alpha*x(i)$ is provided.

Step1: the row address of the start and the end of the data in the subarray are broadcasted (or individually set, depending of the layout) to be captured by the controller circuit. The instruction and the constant $\alpha$ are also broadcasted to all subarrays to be captured in the instruction buffer and the temp registers.

Step2: in all subarrays, one row of the vector x is read and stored in row 1 of the row buffer circuit.

Step3: in each cycle, row 1 of the row buffer circuit shifts one column toward the ALPU.

Step4: in the same cycle, multiplier multiplies a by the last shifted column of row 1 of the row buffer circuit.

Step5: in the same cycle, the previous output of the multiplier is shifted to row 2 of the row buffer circuit.

Step6: if the row 1 of the row buffer circuit (or row 2 of the row buffer circuit) is fully accessed, the controller circuit reads a new row from (write Walker2 to) the subarray.

Step7: controller increases the row address by one and repeats the step3-step6 until the row address is equal to the row address of the end of data.

In some embodiments multiple operations per element may be supported. In particular, for operations such as AXPY($y(i)=\alpha x(i)+y(i)$), matrix-vector, and matrix-matrix multiplication, which have both addition and multiplication, an optimized program can issue multiplication and addition per each cycle and uses the result of previous multiplication as one of the inputs of the addition. This way the two operations are pipelined. To this end both opCode1 and opCode2, in FIG. 6 are used.

In some embodiments minimizing inter-subarray data movement may be supported. In particular, many algorithms such as Reduction and Scan exhibit data dependencies. For example, in Scan, the value of each output element depends on the previous output. Embodiments according to the invention can support such algorithms as the data of the row buffer circuit is sequentially processed. However, due to inherent data dependency, there may be data dependency among operations in subarrays. An optimized method may reduce inter-subarray data movement by proper partitioning. For example, for a pre-fix sum, data among subarrays may be partitioned and the pre-fix sum can be compute for each partition in parallel. Then the in-logic layer core collects the partial sums, calculates the prefix sum for all subarrays, and distributes the partial sums to all subarrays to be added to the previous results.

In some embodiments overlapping broadcasting and computation may be supported. In particular, when mapping applications to in-situ accelerators, many algorithms require sharing values among subarrays. For ex-ample, in matrix-vector multiplication, each row can be mapped to each subarray. As another example, in k-nearest neighbor algorithm (where there is a need to calculate the Euclidean distance between the input and all other points), each point can be mapped (each point has many features) to each subarray. Embodiments according to the present invention may overlap computation and broadcasting. In one cycle, a one-word value can be broadcasted on GDLs and perform the computation on broadcasted value in the previous cycle.

In some embodiments an optimized layout can be supported. Optimization of layout can significantly affect the performance of applications, for which the processing time of a row varies in different subarrays. To represent sparse matrices (where most of the values are zero), a few formats can be employed. One of the most popular formats is the compressed sparse row (CSR). This format represents a matrix M by three arrays containing three values: (i) nonzero values, (ii) the positions of the start of the rows, and (iii)

column indices. Since the values of the vector are being broadcasted, when a controller circuit detects a fully accessed row buffer circuit in any of the subarrays, the process, in all subarrays, should wait until a new row is read into the row buffer circuit. Therefore each non-zero value and its corresponding column index can be placed in the same array and mark the start of the new row by a negative column index. Accordingly, only one row buffer circuit may be needed for computation. Therefore while a row is being processed, another row is captured in another row buffer circuit and computation continues by switching and renaming to another row buffer circuit.

In the drawings, the shapes and dimensions of elements may be exaggerated for clarity, and the same reference numerals will be used throughout to designate the same or like elements. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

It also will be understood that, as used herein, the terms "row" and "column" indicate two non-parallel directions that may be orthogonal to one another. However, the terms row and column do not indicate a particular horizontal or vertical orientation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated elements but do not preclude the presence or addition of one or more other elements.

While exemplary embodiments have been shown and described above, it will be apparent to those skilled in the art that modifications and variations could be made without departing from the spirit and scope of the present disclosure as defined by the appended claims.

What is claimed is:

1. A method of processing data in a memory comprising:
   accessing an array of memory cells located on a semiconductor memory die to provide a row of data including n bits;
   latching the n bits in two or more row buffer circuits which are adjacent to the array of memory cells on the semiconductor memory die to provide latched n bits, the row buffer circuits operatively coupled to a column address selection circuit on the semiconductor memory die to provide at least two portions of the n latched bits as data output from the semiconductor memory die responsive to a memory read operation; and
   serially transferring, in portions, the latched n bits in the row buffer circuit to an arithmetic logic unit (ALU) circuit located adjacent to the row buffer circuit on the semiconductor memory die.

2. The method of claim 1 wherein the serially transferring comprises:
   storing a code in a sequential logic circuit associated with the latched n bits that provides a sequence for enabling portions of the n latched bits to the ALU circuit.

3. The method according to claim 2 wherein accessing the array of memory cells comprises accessing the array of memory cells located on the semiconductor memory die to provide a first row of data including a first row of n bits, wherein the code associated with the latched n bits comprises a first code, the method further comprising:
   accessing the memory array to provide a second row of data including a second row of n bits;
   latching the second row of n bits in the row buffer circuit to provide second latched n bits;
   storing a second code in a second sequential logic circuit associated with the second latched n bits that provides a sequence for enabling second portions of the second n latched bits to the ALU circuit; and
   serially transferring, in portions, the second latched n bits to the ALU circuit using the second code to sequentially enable the second portions to the ALU according to the sequence.

4. The method according to claim 3 further comprising:
   performing an operation in the ALU circuit on values including the serially transferred first portions of the first latched n bits the serially transferred second portions according to the first and second codes, respectively to provide one or more ALU result in each cycle.

5. The method according to claim 4 serially transferring the row of ALU result data in portions corresponding to the first and/or second portions to provide one or more rows of n bits in the row buffer circuit.

6. The method according to claim 5 further comprising:
   receiving the operation at a controller circuit located adjacent to the array on semiconductor memory die, wherein the operation includes one or more operands;
   providing the operation from the controller circuit to the ALU circuit, wherein the operands of the operation includes the portions of row buffers that are sequentially accessed.

7. The method according to claim 5 wherein the operation comprises a compare operation using less than all bits in first and second latched bits as operands for the compare operation.

8. The method according to claim 1 further wherein accessing the array of memory cells comprises accessing the array of memory cells located on the semiconductor memory die to provide a first row of data including a row of latched n bits, wherein the code associated with the latched n bits comprises a first code, the method further comprising:

sorting the row of latched n bits responsive to a sort operation provided to the ALU circuit to output each portion of the row of latched n bits into either a second row of data including a second row of n bits in the row buffer circuit or into a third row of data including a third row of n bits in the row buffer circuit.

9. The method according to claim 1 wherein accessing the array of memory cells located on the semiconductor memory die to provide the row of data including n bits comprises accessing a first array of memory cells located to provide a first row of data including n bits, the method further comprising:

latching the first row of data including n bits in one or more row buffer circuits adjacent to the first array of memory cells to provide the first latched n bits;

accessing a second array of memory cells located on the semiconductor memory die to provide a second row of data including n bits, wherein the n bits in the first row of data in the first array of memory cells are interleaved with the n bits in the second row of data in the second array of memory cells;

latching the second row of data including n bits in one or more row buffer circuits adjacent to the second array of memory cells to provide second latched n bits; and serially transferring, in portions, the first and second latched n bits without interleaving to the ALU circuit.

10. The method according to claim 1 wherein the array of memory cells is arranged as a plurality of adjacent memory MATs each configured to provide a respective sub-set of the row of data including the n bits in a MAT interleaved format, wherein the one or more row buffer circuits comprises a plurality of row buffer circuits each configured to store one of the respective sub-set of the row of data therein, the method further comprising:

shifting each of the respective sub-set of the rows of data through a pipeline of a helper flip-flop circuits to an edge of the array of memory cells.

11. A row buffer memory circuit comprising:

a plurality of rows of storage circuits configured to store row-major ordered data received from a memory array in the plurality of rows of storage circuits and configured to sequentially transfer portions of the row-major ordered data into and/or out of the row buffer memory circuit; and a plurality of sequential enable storage circuits, coupled to the plurality of rows of storage circuits and configured to sequentially enable portions of the row-major ordered data to/from the row buffer memory circuit.

12. The row buffer memory circuit of claim 11 wherein at least one of the plurality of rows of storage circuits is operatively coupled to a respective plurality of sense amplifier circuits configured to amplify the row-major ordered data received via bit lines from the memory array.

13. The row buffer memory circuit of claim 12 wherein inputs of the at least one of the plurality of rows of storage circuits are coupled to respective outputs of the respective plurality of sense amplifier circuits.

14. The row buffer memory circuit of claim 11 wherein the plurality of rows of storage circuits comprise latch circuits.

15. The row buffer memory circuit of claim 11 further comprising:

a plurality of pass-transistors coupled to respective outputs of the plurality of rows of storage circuits and operatively coupled to outputs of the plurality of sequential enable storage circuits, wherein the plurality of pass-transistors are configured to allow/block the portions of the row-major ordered data from a bus to/from the row buffer memory circuit.

16. A row buffer memory circuit comprising:

a plurality of rows of storage circuits configured to store row-major ordered data received from a memory array in the plurality of rows of storage circuits and configured to sequentially transfer portions of the row-major ordered data into and/or out of the row buffer memory circuit, wherein the plurality of rows of storage circuits are configured to sequentially transfer the portions of the row-major ordered data into and/or out of the row buffer memory circuit in column-major order.

17. A memory device comprising:

a first sub-array located in an integrated circuit memory device package and configured to provide a first portion of a row of data;

a first row buffer memory circuit located in the integrated circuit memory device package adjacent to the first sub-array and configured to store first row-major ordered data received from the first sub array and configured to sequentially transfer the first row-major ordered data into and/or out of the first row buffer memory circuit in column-major order;

a second sub-array located on the semiconductor memory die configured to provide a second portion of the row of data, wherein the first and second portions provide the row of data including the n bits;

a second row buffer memory circuit located in the integrated circuit memory device package adjacent to the second sub-array and configured to store second row-major ordered data received from the second sub array and configured to sequentially transfer the second row-major ordered data out of the second row buffer memory circuit in column-major order;

an arithmetic logic unit (ALU) circuit in the integrated circuit memory device package adjacent to the first and second sub-arrays, wherein first and second inputs of the ALU circuit are coupled to the sequentially transferred first and second row-major ordered data received in the column-major order, to global data lines, at least one temporary register, and an output of the ALU circuit; and a control circuit operatively coupled to the first and second sub arrays, to the first and second row buffer memory circuits, and to the ALU circuit and configured to select inputs to the first and second inputs to the ALU circuit and to provide instruction to ALU circuit to operate on the first and second inputs to the ALU circuit.

18. The memory device of claim 17 further comprising:

a plurality of first sequential enable storage circuits, coupled to the first row buffer memory circuit and configured to provide a one hot encoded value to sequentially enable portions of the first row-major ordered data to/from the first row buffer memory circuit; and a plurality of second sequential enable storage circuits, coupled to the second row buffer memory circuit and configured to provide a one hot encoded value to sequentially enable portions of the second row-major ordered data to/from the second row buffer memory circuit.

19. The memory device of claim 18 further comprising:

a plurality of first pass-transistors coupled to first row buffer memory circuit respective outputs and operatively coupled to outputs of the plurality of first sequential enable storage circuits, wherein the plurality of first pass-transistors are configured to allow/block the portions of the first row-major ordered data from a bus to/from the first row buffer memory circuit;

a plurality of second pass-transistors coupled to second row buffer memory circuit respective outputs and operatively coupled to outputs of the plurality of second sequential enable storage circuits, wherein the plurality of second pass-transistors are configured to allow/block the portions of the second row-major ordered data from a bus to/from the second row buffer memory circuit; and a first plurality of rows of storage circuits configured to store row-major ordered data received from a memory array in the plurality of rows of storage circuits and configured to sequentially transfer portions of the row-major ordered data into and/or out of the row buffer memory circuit.

\* \* \* \* \*

UNITED STATES PATENT AND TRADEMARK OFFICE
CERTIFICATE OF CORRECTION

PATENT NO. : 11,049,551 B2  
APPLICATION NO. : 16/682151  
DATED : June 29, 2021  
INVENTOR(S) : Lenjani et al.

Page 1 of 1

It is certified that error appears in the above-identified patent and that said Letters Patent is hereby corrected as shown below:

In the Specification

Column 5, Line 10: Please correct "subarray-level and which" to read -- subarray-level which --

Column 5, Line 37: Please correct "In some embodiments, rows" to read -- In some embodiments, (i) rows --

In the Claims

Column 15, Claim 9, Line 17: Please correct "memory cells to provide the first" to read -- memory cells to provide first --

Signed and Sealed this
Twenty-second Day of March, 2022

Drew Hirshfeld
*Performing the Functions and Duties of the*
*Under Secretary of Commerce for Intellectual Property and*
*Director of the United States Patent and Trademark Office*